United States Patent
Moon et al.

(10) Patent No.: US 9,425,242 B2
(45) Date of Patent: Aug. 23, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Joong-Soo Moon, Yongin (KR); Hyun-Chol Bang, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 143 days.

(21) Appl. No.: 14/198,696

(22) Filed: Mar. 6, 2014

(65) Prior Publication Data

US 2014/0312326 A1 Oct. 23, 2014

(30) Foreign Application Priority Data

Apr. 23, 2013 (KR) .................. 10-2013-0044902

(51) Int. Cl.
*H01L 27/32* (2006.01)
*H01L 27/12* (2006.01)

(52) U.S. Cl.
CPC ........ *H01L 27/3262* (2013.01); *H01L 27/1255* (2013.01); *H01L 27/3265* (2013.01)

(58) Field of Classification Search
CPC ............ H01L 27/1255; H01L 27/3262; H01L 27/3265
See application file for complete search history.

(56) References Cited

U.S. PATENT DOCUMENTS 6,825,496 B2 * 11/2004 Yamazaki ........... H01L 27/3265
257/72

FOREIGN PATENT DOCUMENTS

| JP | 2008-287135 A | 11/2008 |
| KR | 10-2011-0036456 A | 4/2011 |
| KR | 10-2004-0005260 A | 1/2014 |

* cited by examiner

*Primary Examiner* — Ermias Woldegeorgis
*Assistant Examiner* — Benjamin Tzu-Hung Liu
(74) *Attorney, Agent, or Firm* — Lee & Morse, P.C.

(57) ABSTRACT

An organic light emitting diode (OLED) display includes: a substrate; a first semiconductor layer and a second semiconductor layer separated from each other on a same surface of the substrate, a first insulating layer on the first semiconductor layer and the second semiconductor layer, a first gate electrode and a second gate electrode respectively overlapping the first semiconductor layer and the second semiconductor layer, a second insulating layer on the first gate electrode and the second gate electrode; a first storage electrode overlapping the first gate electrode on the second insulating layer, a third insulating layer on the first storage electrode, and a second storage electrode overlapping the first storage electrode on the third insulating layer.

9 Claims, 6 Drawing Sheets

ORGANIC LIGHT EMITTING DIODE DISPLAY

CROSS-REFERENCE TO RELATED APPLICATION

Korean Patent Application No. 10-2013-0044902, filed on Apr. 23, 2013, in the Korean Intellectual Property Office, and entitled: "Organic Light Emitting Diode Display," is incorporated by reference herein in its entirety.

BACKGROUND

1. Field

The described technology relates generally to an organic light emitting diode (OLED) display.

2. Description of the Related Art

An organic light emitting diode display includes two electrodes, i.e., a cathode and an anode, and an organic emission layer interposed therebetween. Electrons injected from the cathode and holes injected from the anode are bonded to each other in the organic emission layer to form excitons and light is emitted while the excitons discharge energy.

The organic light emitting diode display includes a plurality of pixels, each including an organic light emitting diode formed of a cathode, an anode, and an organic emission layer, and a plurality of transistors and storage capacitors for driving the organic light emitting diode are formed in each pixel. The plurality of transistors basically includes a switching transistor and a driving transistor.

The above information disclosed in this Background section is only for enhancement of understanding of the background of the described technology and therefore it may contain information that does not form the prior art that is already known in this country to a person of ordinary skill in the art.

SUMMARY

Embodiments are directed to providing an organic light emitting diode (OLED) display, including a substrate, a first semiconductor layer and a second semiconductor layer separated from each other on a same surface of the substrate, a first insulating layer on the first semiconductor layer and the second semiconductor layer, a first gate electrode and a second gate electrode respectively overlapping the first semiconductor layer and the second semiconductor layer, a second insulating layer on the first gate electrode and the second gate electrode, a first storage electrode overlapping the first gate electrode on the second insulating layer, a third insulating layer on the first storage electrode, and a second storage electrode overlapping the first storage electrode on the third insulating layer.

The first semiconductor layer may be a driving semiconductor layer, the second semiconductor layer may be a switching semiconductor layer, the first gate electrode may be a driving gate electrode, the second gate electrode may be a switching gate electrode, the first insulating layer may be a gate insulating layer, the second insulating layer may be a first interlayer insulating layer, and the third insulating layer may be a second interlayer insulating layer.

The driving semiconductor layer may have a non-linear shape in plan view.

The non-linear shape may be one of curved, a zigzag shape, an elongated "5" shape, a "ㄹ" shape, an "S" shape, an "M" shape, and a "W" shape.

The gate insulating layer may include a first gate insulating layer covering the first and second semiconductor layers, and a second gate insulating layer on the first gate insulating layer and covering the switching gate electrode, wherein the driving gate electrode is on the second gate insulating layer.

The organic light emitting diode (OLED) display may include a data line and a driving voltage line formed with the same layer as the second storage electrode and respectively transmitting a data signal and a driving voltage.

The second storage electrode may be an extension of the driving voltage line.

The first storage electrode may be connected to the driving gate electrode through a contact hole in the first interlayer insulating layer.

The organic light emitting diode (OLED) display may include a protective layer covering the second interlayer insulating layer and the second storage electrode, and an organic light emitting diode (OLED) on the protective layer.

The driving gate electrode and the switching gate electrode may be on a same surface of the first insulating layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

The exemplary embodiment will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, embodiments are not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the phrase "on a flat surface" means when an object portion is viewed from the above, and the phrase "on a cross-section" means when a cross-section taken by vertically cutting an object portion is viewed from the side.

Hereafter, an organic light emitting diode (OLED) display according to the first exemplary embodiment will be described with reference to FIG. 1 to FIG. 5.

Figure 1:
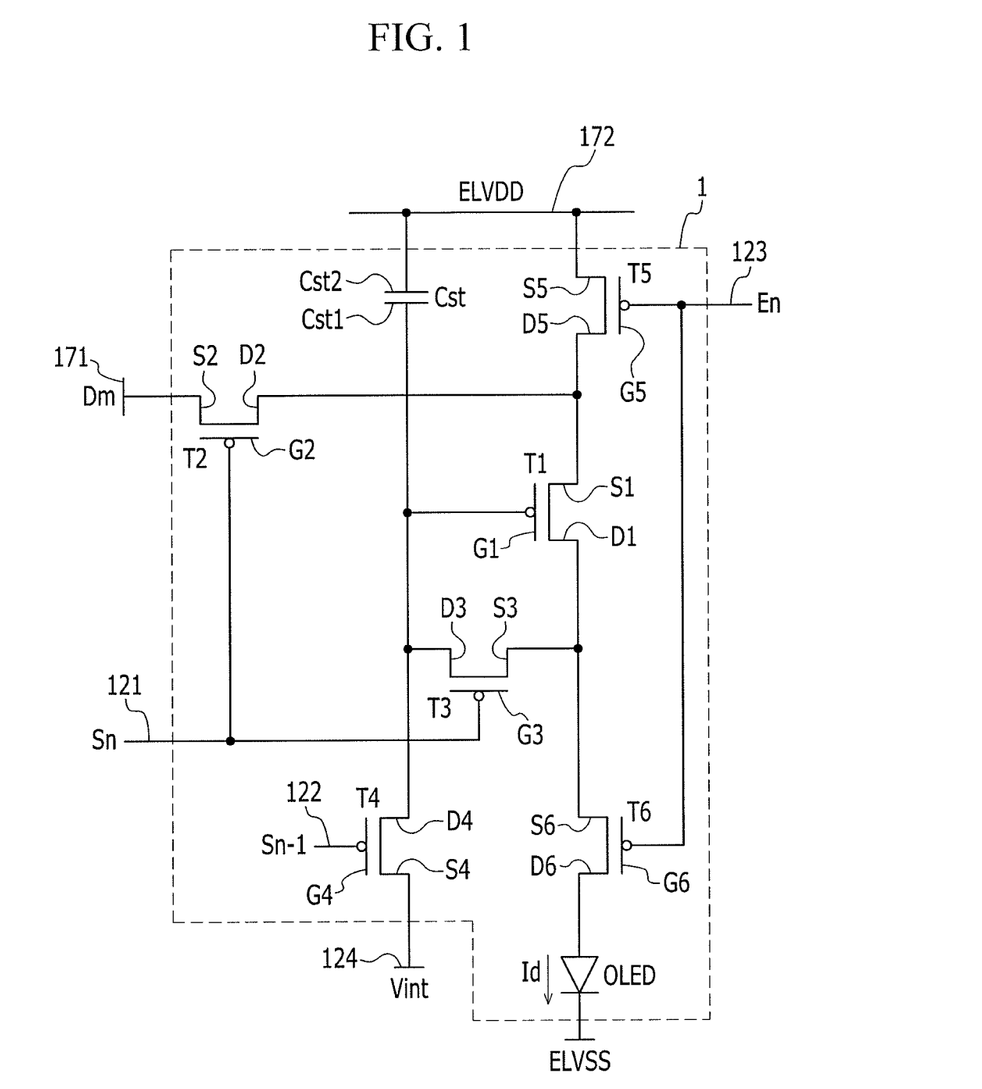
FIG. 1 illustrates an equivalent circuit of a pixel of an organic light emitting diode (OLED) display according to the first exemplary embodiment.

FIG. 1 illustrates an equivalent circuit of a pixel of an organic light emitting diode (OLED) display according to the first exemplary embodiment.

As shown in FIG. 1, one pixel 1 of an organic light emitting diode display according to the first exemplary embodiment includes a plurality of signal lines 121, 122, 123, 124, 171, and 172, and a plurality of transistors T1, T2, T3, T4, T5, and T6, a storage capacitor Cst, and an organic light emitting diode (OLED) connected to the plurality of signal lines.

The transistors include a driving transistor (driving thin film transistor) T1, a pixel switching transistor (switching thin film transistor) T2, a compensation transistor T3, an initialization transistor T4, an operation control transistor T5, and a light emission control transistor T6.

The signal lines include a scan line 121 transferring a scan signal Sn, a prior scan line 122 transferring a prior scan signal Sn-1 to the initialization transistor T4, a light emission control line 123 transferring a light emission control signal En to the operation control transistor T5 and the light emission control transistor T6, a data line 171 crossing the scan line 121 and transferring a data signal Dm, a driving voltage line 172 transferring a driving voltage ELVDD and formed substantially parallel to the data line 171, and an initialization voltage line 124 transferring an initialization voltage Vint initializing the driving transistor T1.

A gate electrode G1 of the driving transistor T1 is connected to a first end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives a data signal Dm according to a switching operation of the pixel switching transistor T2 to supply a driving current Id to the organic light emitting diode (OLED).

A gate electrode G2 of the pixel switching transistor T2 is connected to the scan line 121, a source electrode S2 of the pixel switching transistor T2 is connected to the data line 171, and a drain electrode D2 of the pixel switching transistor T2 is connected via the operation control transistor T5 to the driving voltage line 172 while being connected to the source electrode S1 of the driving transistor T1. The pixel switching transistor T2 is turned on according to the scan signal Sn transferred through the scan line 121 to perform a switching operation for transferring the data signal Dm transferred to the data line 171 to the source electrode of the driving transistor T1.

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to an end Cst1 of the storage capacitor Cst, a drain electrode D4 of the initialization transistor T4, and the gate electrode G1 of the driving transistor T1. The compensation transistor T3 is turned on according to the scan signal Sn transferred through the scan line 121 to connect the gate electrode G1 and the drain electrode D1 of the driving transistor T1 to each other, thus performing diode-connection of the driving transistor T1.

The gate electrode G4 of the initialization transistor T4 is connected to the prior scan line 122, the source electrode S4 of the initialization transistor T4 is connected to the initialization voltage line 124, and the drain electrode D4 of the initialization transistor T4 is connected to the first end Cst1 of the storage capacitor Cst, the drain electrode D3 of the compensation transistor T3, and the gate electrode G1 of the driving transistor T1. The initialization transistor T4 is turned on according to the prior scan signal Sn-1 transferred through the prior scan line 122 to transfer the initialization voltage Vint to the gate electrode G1 of the driving transistor T1, thus performing an initialization operation for initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the pixel switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned on according to the light emission control signal En transferred through the light emission control line 123 to transfer the driving voltage ELVDD to the organic light emitting diode (OLED), thus allowing the driving current Id to flow in the organic light emitting diode (OLED).

A second end Cst2 of the storage capacitor Cst is connected to the driving voltage line 172, and a cathode of the organic light emitting diode (OLED) is connected to a common voltage ELVSS. Accordingly, the organic light emitting diode (OLED) receives a driving current Id from the driving transistor T1 to emit light, thereby displaying an image.

Hereinafter, a detailed operation process of one pixel of the organic light emitting diode display according to the first exemplary embodiment will be described.

First, a prior scan signal Sn-1 at a low level is supplied through the prior scan line 122 during an initialization period. Then, the initialization transistor T4 is turned on corresponding to the prior scan signal Sn-1 at the low level, and the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn at the low level is supplied through the scan line 121 during a data programming period.

Then, the pixel switching transistor T2 and the compensation transistor T3 are turned on corresponding to the scan signal Sn at the low level.

In this case, the driving transistor T1 is diode-connected by the turned-on compensation transistor T3, and is biased in a forward direction.

Then, a compensation voltage Dm+Vth (Vth is a negative value) obtained by subtracting a threshold voltage Vth of the driving transistor T1 from the voltage of the data signal Dm supplied from the data line 171 is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Subsequently, the level of the light emission control signal En supplied from the light emission control line 123 during the light emission period is changed from the high level to the low level. Then, the operation control transistor T5 and the light emission control transistor T6 are turned on by the light emission control signal En at the low level during the light emission period.

Then, the driving current Id is generated according to a difference between the voltage of the gate electrode of the driving transistor T1 and the driving voltage ELVDD, and the driving current Id is supplied through the light emission control transistor T6 to the organic light emitting diode (OLED). The gate-source voltage Vgs of the driving transistor T1 is maintained at "(Dm+Vth)-ELVDD" by the storage capacitor Cst during the light emission period. The driving current Id is proportional to a square of a value obtained by subtracting the threshold voltage from the source-gate voltage, that is, "(Dm-ELVDD)2", according to a current-voltage relationship of the driving transistor T1. Accordingly, the driving current Id is determined regardless of the threshold voltage Vth of the driving transistor T1.

Next, a detailed structure of the pixel of the organic light emitting diode (OLED) display shown in FIG. 1 will be described with reference to FIG. 2 to FIG. 5 as well as FIG. 1.

Figure 2:
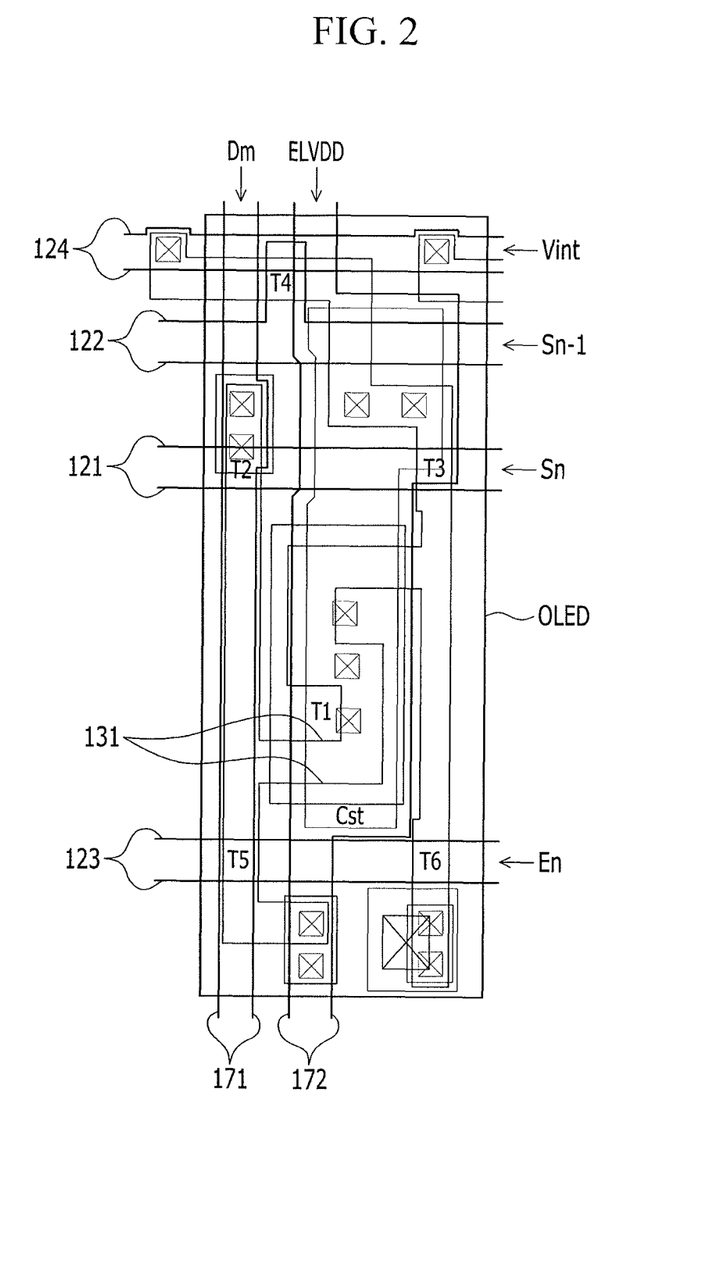
FIG. 2 illustrates a view of a plurality of transistors and capacitors of an organic light emitting diode (OLED) display according to the first exemplary embodiment.
Figure 3:
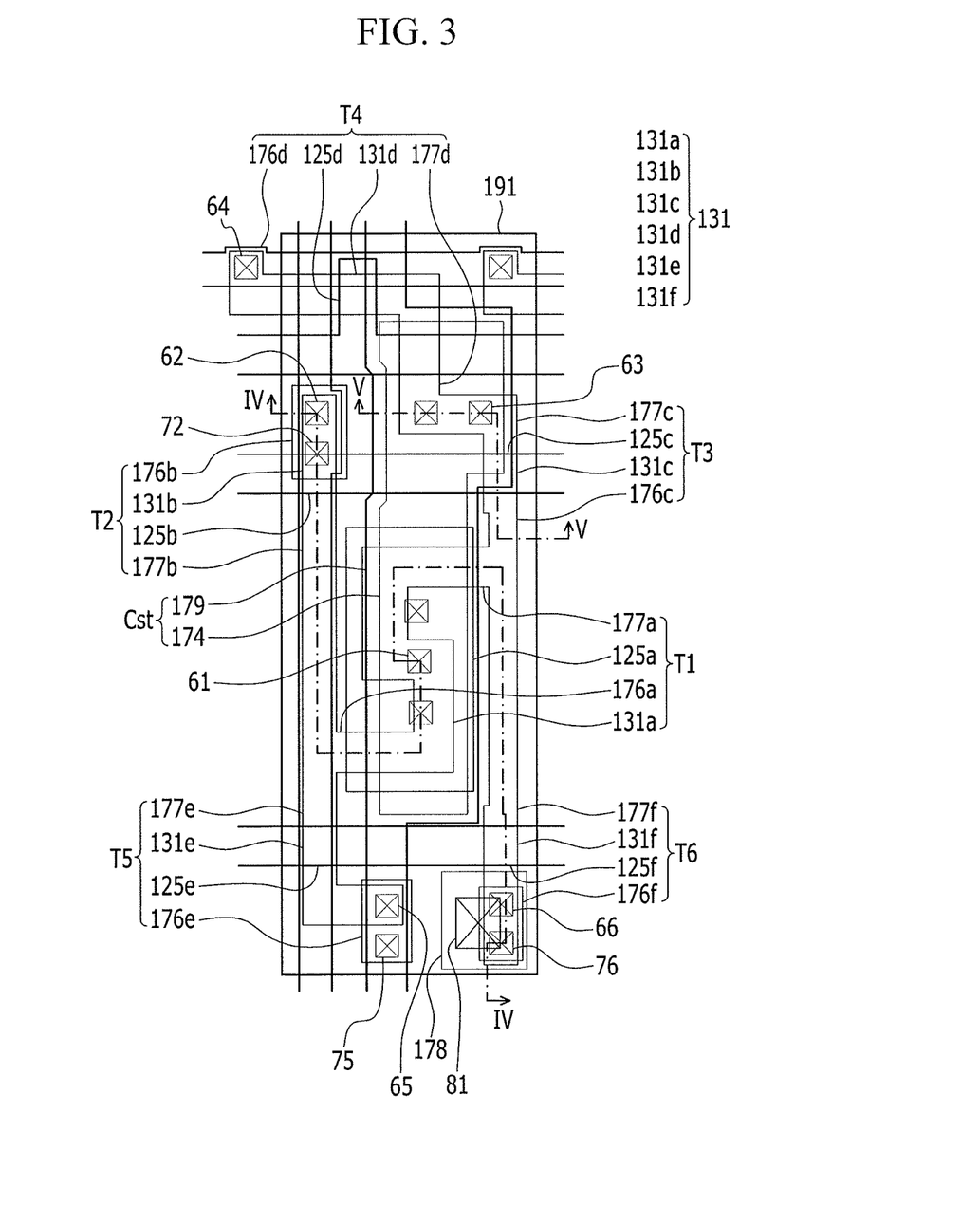
FIG. 3 illustrates a detailed layout view of one pixel of FIG. 2.
Figure 4:
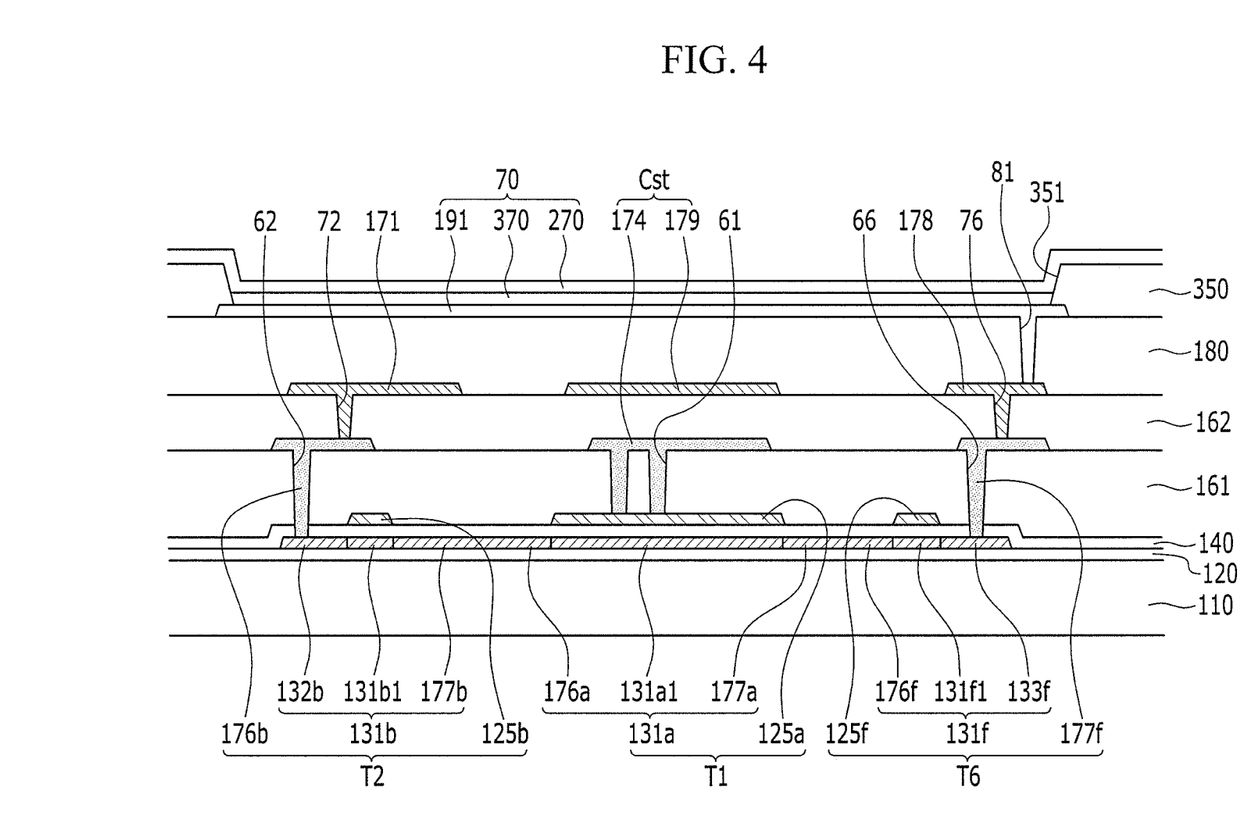
FIG. 4 illustrates a cross-sectional view of the organic light emitting diode (OLED) display of FIG. 3 taken along the line IV-IV.
Figure 5:
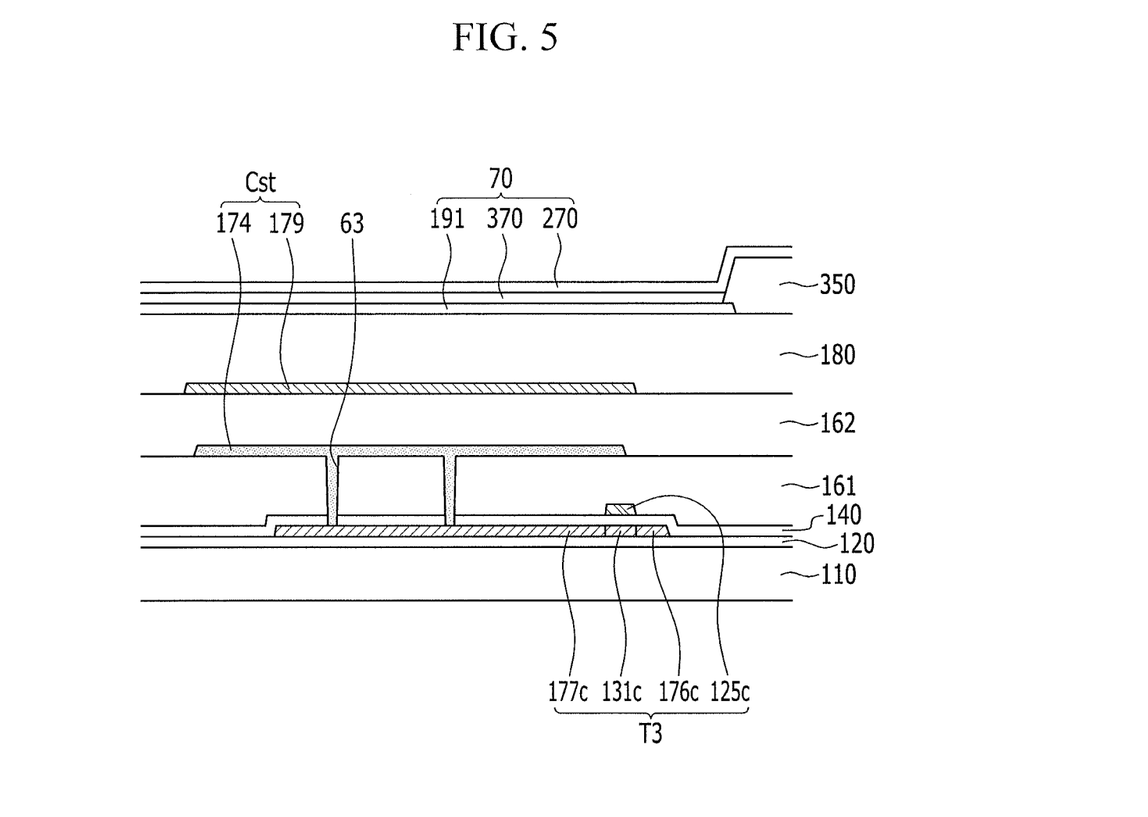
FIG. 5 illustrates a cross-sectional view of the organic light emitting diode (OLED) display of FIG. 3 taken along the line V-V.

FIG. 2 illustrates a view of a plurality of transistors and capacitors of an organic light emitting diode (OLED) display according to the first exemplary embodiment. FIG. 3 is a detailed layout view of one pixel of FIG. 2. FIG. 4 is a cross-sectional view of the organic light emitting diode (OLED) display of FIG. 3 taken along the line IV-IV. FIG. 5 is a cross-sectional view of the organic light emitting diode (OLED) display of FIG. 3 taken along the line V-V.

As shown in FIG. 2, the organic light emitting diode (OLED) display according to the first exemplary embodiment includes the scan line 121, the prior scan line 122, the light emission control line 123, and the initialization voltage line 124 applying the scan signal Sn, the prior scan signal Sn-1, the light emission control signal En, and the initialization voltage Vint, respectively, formed in a row direction, and the data line 171 and the driving voltage line 172 crossing all the scan line 121, the prior scan line 122, the light emission control line 123, and the initialization voltage line 124, and applying the data signal Dm and the driving voltage ELVDD, respectively, to the pixel.

Further, the driving transistor T1, the pixel switching transistor T2, the compensation transistor T3, the initialization transistor T4, the operation control transistor T5, the light emission control transistor T6, the storage capacitor Cst, and the organic light emitting diode (OLED) are formed in the pixel.

The driving transistor T1, the pixel switching transistor T2, the compensation transistor T3, the initialization transistor T4, the operation control transistor T5, and the light emission control transistor T6 are formed along a semiconductor layer 131 (see, e.g., FIG. 3). The semiconductor layer 131 may be bent in various shapes. The semiconductor layer 131 may be made of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO$_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). When the semiconductor layer 131 is formed of an oxide semiconductor, a separate protective layer may be added to protect the oxide semiconductor that is weak to external environment factors such as high temperatures.

The semiconductor layer 131 includes a channel region that is doped with an N-type impurity or a P-type impurity, and a source region and a drain region at both sides of the channel region and doped a doping impurity having a type that is opposite to that of the doping impurity doped in the channel region.

Hereinafter, a flat surface structure of the organic light emitting diode display according to the first exemplary embodiment will first be described in detail with reference to FIGS. 2 and 3, and a cross-sectional structure thereof will be described in detail with reference to FIGS. 4 and 5.

First, as shown in FIGS. 2 and 3, the pixel 1 of the organic light emitting diode display according to the first exemplary embodiment includes the driving transistor T1, the switching transistor T2, the compensation transistor T3, the initialization transistor T4, the operation control transistor T5, the light emission control transistor T6, the storage capacitor Cst, and the organic light emitting diode (OLED). The transistors T1, T2, T3, T4, T5, and T6 are formed along the semiconductor layer 131. The semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

The driving transistor T1 includes the driving semiconductor layer 131a, a driving gate electrode 125a, a driving source electrode 176a, and a driving drain electrode 177a.

The driving semiconductor layer 131a may be curved, may have a zigzag shape, and may be elongated with a "5" shape in a plan view. As described above, by forming the driving semiconductor layer 131a of the curved shape, a long driving semiconductor layer 131a may be formed in a narrow space. Accordingly, a long driving channel region 131a1 of the driving semiconductor layer 131a may be formed such that a driving range of the gate voltage applied to the driving gate electrode 125a is increased. Since the driving range of the gate voltage is increased, a grayscale of light emitted from an organic light emitting diode (OLED) can be more finely controlled by changing the magnitude of the gate voltage. As a result, resolution of the organic light emitting diode display may be increased and improve display quality may be improved. By varying the shape of the driving semiconductor layer 131a, various additional examples of non-linear shapes in plan view, e.g., "己", "S", "M", and "W" shapes are possible.

The driving source electrode 176a corresponds to the driving source region 176a doped with the impurity in the driving semiconductor layer 131a, and the driving drain electrode 177a corresponds to the driving drain region 177a doped with the impurity in the driving semiconductor layer 131a. The driving gate electrode 125a overlaps the driving semiconductor layer 131a and may be formed with the same layer as the scan line 121, the prior scan line 122, the light emission control line 123, a switching gate electrode 125b, a compensation gate electrode 125c, an initialization gate electrode 125d, an operation control gate electrode 125e, and a light emission control gate electrode 125f.

The switching transistor T2 includes the switching semiconductor layer 131b, the switching gate electrode 125b, a switching source electrode 176b, and a switching drain electrode 177b. The switching source electrode 176b is connected to the switching semiconductor layer 131b through a contact hole 62 and is simultaneously connected to the data line 171 through a contact hole 72. The switching drain electrode 177b corresponds to the switching drain region 177b doped with the impurity in the switching semiconductor layer 131b.

The compensation transistor T3 includes the compensation semiconductor layer 131c, the compensation gate electrode 125c, a compensation source electrode 176c, and a compensation drain electrode 177c. The compensation source electrode 176c corresponds to the compensation source region 176c doped with the impurity in the compensation semiconductor layer 131c and the compensation drain electrode 177c corresponds to the compensation drain region 177c doped with the impurity.

The initialization transistor T4 includes the initialization semiconductor layer 131d, the initialization gate electrode 125d, an initialization source electrode 176d, and an initialization drain electrode 177d. The initialization source electrode 176d connects the initialization semiconductor layer 131d and the initialization voltage line 124 to each other through a contact hole 64. The initialization drain electrode 177d corresponds to the initialization drain region 177d doped with the impurity.

The operation control transistor T5 includes the operation control semiconductor layer 131e, the operation control gate electrode 125e, an operation control source electrode 176e, and an operation control drain electrode 177e. The operation control source electrode 176e is connected to the operation control semiconductor layer 131e through a contact hole 65 and is simultaneously connected to the driving voltage line 172 through a contact hole 75. The operation control drain electrode 177e corresponds to the operation control drain region 177e doped with the impurity in the operation control semiconductor layer 131e.

The light emission control transistor T6 includes the light emission control semiconductor layer 131f, the light emission control gate electrode 125f, a light emission control source electrode 176f, and a light emission control drain electrode 177f. The light emission control source electrode 176f corresponds to the light emission control source region 176f doped with the impurity in the light emission control semiconductor layer 131f. The light emission control drain electrode 177f is connected to the light emission control semiconductor layer 131f through a contact hole 66 and is simultaneously connected to the light emission control connection plate 178 through a contact hole 76.

A first end of the driving semiconductor layer 131a of the driving transistor T1 is connected to the switching semiconductor layer 131b and the compensation semiconductor layer 131c. A second end of the driving semiconductor layer 131a is connected to the operation control semiconductor layer 131e and the light emission control semiconductor layer 131f. Therefore, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage electrode 174 and a second storage electrode 179 disposed via a second interlayer insulating layer 162 interposed therebetween. The first storage electrode 174 may be formed with the same layer as the switching source electrode 176b, the operation control source electrode 176e, and the light emission control drain electrode 177f. The second storage electrode 179 as an enlarged part of the driving voltage line 172 may be formed with the same material as the data line 171 and a light emission control connection plate 178.

The second interlayer insulating layer 162 may be a dielectric material, and the storage capacitance is determined by charges charged in the storage capacitor Cst and the voltage between two charging plates 174 and 172.

The first storage electrode 174 is connected to the compensation drain electrode 177c through a contact hole 63 formed in a first interlayer insulating layer 161 and a gate insulating layer 140, and is simultaneously connected to the driving gate electrode 125a through a contact hole 61 formed in the first interlayer insulating layer 161. The second storage electrode 179 is an enlarged portion of the driving voltage line 172.

Accordingly, the storage capacitor Cst stores the storage capacitance corresponding to the difference between the driving voltage ELVDD transmitted to the second storage electrode 179 through the driving voltage line 172 and the gate voltage of the driving gate electrode 125a.

The switching transistor T2 is used as a switching diode for selecting a pixel that is to emit light. The switching gate electrode 125b is connected to the scan line 121, the switching source electrode 176b is connected to the data line 171, and the switching drain electrode 177b is connected to the driving transistor T1 and the operation control transistor T5. The light emission control drain electrode 177f of the light emission control transistor T6 is connected to the light emission control connection plate 178 through the contact hole 76 formed in the second interlayer insulating layer 162. The light emission control connection plate 178 is directly connected to the pixel electrode 191 of an organic light emitting diode 70 through contact hole 81 formed in the protective layer 180.

Hereinafter, referring to FIGS. 4 and 5, a structure of the organic light emitting diode display according to the first exemplary embodiment will be described in detail according to the deposition order.

In this case, the structure of the transistor will be described based on the driving transistor T1, the switching transistor T2, and the light emission control transistor T6. In addition, the compensation transistor T3 and the initialization transistor T4 have almost the same deposition structure as the driving transistor T1, and the operation control transistor T5 has almost the same lamination structure as the light emission control transistor T6, so are not described in further detail.

A buffer layer 120 is formed on a substrate 110. The substrate 110 may be formed of an insulating substrate made of e.g., glass, quartz, ceramics, plastics, or the like.

The first semiconductor layer 131a and the second semiconductor layer 131b are formed on the buffer layer 120, and the first semiconductor layer 131a and the second semiconductor layer 131b, respectively, are the driving semiconductor layer 131a and the switching semiconductor layer 131b. The light emission control semiconductor layer 131f is also formed on the buffer layer 120.

The driving semiconductor layer 131a includes the driving channel region 131a1, and a driving source region 176a and driving drain region 177a facing each other with the driving channel region 131a1 interposed therebetween. The switching semiconductor layer 131b includes a switching channel region 131b1, and a switching source region 132b and switching drain region 177b facing each other with the switching channel region 131b1 interposed therebetween. The light emission control transistor T6 includes a light emission control channel region 131f1, the light emission control source region 176f, and a light emission control drain region 133f.

The first gate insulating layer 140 may be formed on the switching semiconductor layer 131a, the driving semiconductor layer 131b, and the light emission control semiconductor layer 131f. The first gate insulating layer 140 may be a gate insulating layer 140, and may be formed of silicon nitride (SiNx) or silicon oxide (SiO₂).

The gate wires 121, 122, 123, 125a, 125b, 125f include the scan line 12 including the second gate electrode 125b, the prior scan line 122, the light emission control line 123 including the light emission control gate electrode 125f, and the first gate electrode 125a may be formed on the gate insulating layer 141. The first gate electrode 125a is the driving gate electrode 125a, and the second gate electrode 125b is the switching gate electrode 125b.

A second insulating layer 161 is formed on the gate wires 121, 122, 123, 125b, 125f, and 127, and the gate insulating layer 140. The second insulating layer 161 may be the first interlayer insulating layer 161.

The first data wires 174, 176b, and 177f including the switching source electrode 176b, the first storage electrode 174, and the light emission control drain electrode 177f are formed on the first interlayer insulating layer 161. The first storage electrode 174 overlaps the driving gate electrode 125a.

The switching source electrode 176b is connected to the switching semiconductor layer 131b through the contact hole 62 formed in the first interlayer insulating layer 161 and the gate insulating layer 140. The first storage electrode 174 may be connected to the driving gate electrode 125a through the contact hole 61 formed in the first interlayer insulating layer 161. The light emission control drain electrode 177f may be connected to the light emission control semiconductor layer 131f through the contact hole 66 formed in the first interlayer insulating layer 161 and the gate insulating layer 140.

The third insulating layer 162 is formed on the first interlayer insulating layer 161 and the first data wires 174, 176b, and 177f. The third insulating layer 162 is the second interlayer insulating layer 162. The first interlayer insulating layer 161 and the second interlayer insulating layer 162 may be formed using a ceramic-based material, e.g., silicon nitride (SiNx) or silicon oxide (SiO₂).

The second data wires 171, 172, 178, and 179 including the data line 171, the driving voltage line 172 including the second storage electrode 179, and the light emission control connection plate 178 are formed on the second interlayer insulating layer 162.

The data line 171 is connected to the switching source electrode 176b through the contact hole 72 formed in the second interlayer insulating layer 162. The light emission control connection plate 178 may be connected to the light emission control drain electrode 177f through the contact hole 76 formed in the second interlayer insulating layer 162. The second storage electrode 179 may overlap the first storage electrode 174 via the second interlayer insulating layer 162 interposed therebetween.

As described above, by forming the second storage electrode 179 by the enlarged portion of the driving voltage line 172, the driving gate electrode 125a and the storage capacitor may be formed with the different layer such that the size of the driving transistor T1 and the storage capacitor may be simultaneously increased, thereby improving the image quality.

A protective layer 180 covering the second data wires 171, 172, 178, and 179 is formed on the second interlayer insulating layer 162. A pixel electrode 191 may be formed on the protective layer 180. The pixel electrode 191 may be connected to the light emission control connection plate 178 through the contact hole 81 in the protective layer 180.

A barrier rib 350 is formed on an edge of the pixel electrode 191 and the protective layer 180. The barrier rib 350 may have a barrier rib opening 351 through which the pixel electrode 191 is exposed. The barrier rib 350 may be made of a resin, e.g., a polyacrylate and a polyimide, or a silica-based inorganic material.

An organic emission layer 370 is foamed on the pixel electrode 191 exposed through the barrier rib opening 351. The common electrode 270 may be formed on the organic emission layer 370. The organic light emitting diode 70 including the pixel electrode 191, the organic emission layer 370, and the common electrode 270 may be formed as described above.

Here, the pixel electrode 191 is an anode serving as a hole injection electrode, and the common electrode 270 is a cathode serving as an electron injection electrode. However, the exemplary embodiments are not limited thereto, and the pixel electrode 191 may be the cathode and the common electrode 270 may be the anode according to the driving method of the organic light emitting diode display. Holes and electrons are injected from the pixel electrode 191 and the common electrode 270 into the organic emission layer 370. When excitons, i.e., combinations of the injected holes and electrons, fall from an excited state to a ground state, light is emitted.

The organic emission layer 370 may be formed of a low molecular weight organic material or a high molecular weight organic material, e.g., PEDOT (poly(3,4-ethylenedioxythiophene)). Further, the organic emission layer 370 may be multilayered including one or more of an emission layer, a hole injection layer HIL, a hole transport layer HTL, an electron transport layer ETL, and an electron injection layer EIL. When all the layers are included, the hole injection layer HIL may be disposed on the pixel electrode 191 that is the anode, and the hole transport layer HTL, the emission layer, the electron transport layer ETL, and the electron injection layer EIL may be sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer are respectively formed in a red pixel, a green pixel, and a blue pixel to implement a color image.

Alternatively, the organic emission layer 370 may implement the color image by providing all of the red organic emission layer, the green organic emission layer, and the blue organic emission layer in the red pixel, the green pixel, and the blue pixel together, and forming a red color filter, a green color filter, and a blue color filter for each pixel. As another alternative, a white organic emission layer emitting white light may be formed in all of the red pixel, the green pixel, and the blue pixel, and the red color filter, the green color filter, and the blue color filter may be formed for each pixel to implement the color image. When the color image is implemented using the white organic emission layer and color filters, a deposition mask for forming the red organic emission layer, the green organic emission layer, and the blue organic emission layer does not need to be used, which is advantageous to improve the resolution.

The white organic emission layer described in another example may be formed of one organic emission layer, and may include even a constitution in which a plurality of organic emission layers are laminated to emit white light. For example, a constitution in which at least one yellow organic emission layer and at least one blue organic emission layer are combined to emit light having the white color, a constitution in which at least one cyan organic emission layer and at least one red organic emission layer are combined to emit light having the white color, a constitution in which at least one magenta organic emission layer and at least one green organic emission layer are combined to emit light having the white color, or the like, may be included.

A sealing member (not illustrated) for protecting the organic light emitting diode 70 may be formed on the common electrode 270, may be sealed by a sealant on the substrate 110, and may be formed of various materials such as glass, quartz, ceramic, plastics, and metal. A sealing thin film layer may be formed by depositing an inorganic layer and an organic layer on the common electrode 270 while not using the sealant.

In the first exemplary embodiment, the driving gate electrode and the switching gate electrode may be formed with the same layer. However, to expand the driving range by increasing the size of the driving transistor, the second exemplary embodiment in which the driving gate electrode is formed on a different layer from the switching gate electrode is possible.

Figure 6:
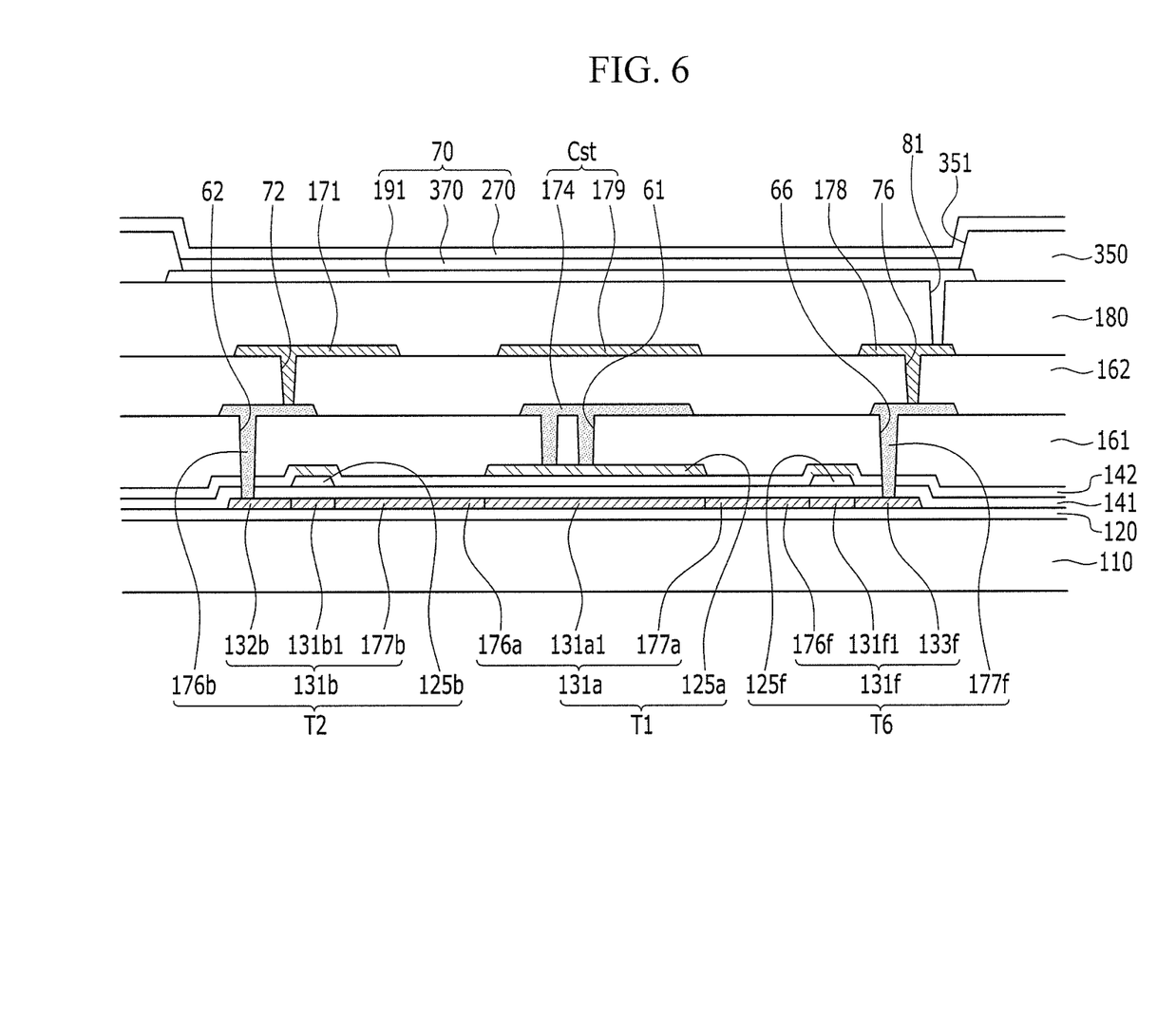
FIG. 6 illustrates a cross-sectional view of an organic light emitting diode (OLED) display according to the second exemplary embodiment.

Next, referring to FIG. 6, an organic light emitting diode (OLED) display according to the second exemplary embodiment will be described. FIG. 6 illustrates a cross-sectional view of an organic light emitting diode (OLED) display according to the second exemplary embodiment. The second exemplary embodiment is substantially equivalent to the first exemplary embodiment shown in FIG. 1 to FIG. 5 except for the driving transistor, such that description of the overlapping structure is omitted.

As shown in FIG. 6, in the organic light emitting diode (OLED) display according to the second exemplary embodiment, a first gate insulating layer 141 is formed on the switching semiconductor layer 131a, the driving semiconductor layer 131b, and the light emission control semiconductor layer 131f.

The first gate wires 121, 122, 123, 125b, and 125f including the scan line 121 including the switching gate electrode 125b, the prior scan line 122, and the light emission control line 123 including the light emission control gate electrode 125f are formed on the first gate insulating layer 141.

A second gate insulating layer 142 is formed on the first gate wires 121, 122, 123, 125b, and 125f and the first gate insulating layer 141. The second gate wire 125a including the driving gate electrode 125a is formed on the second gate insulating layer 142.

As described above, the first gate insulating layer 141 and the second gate insulating layer 142 are formed between the driving semiconductor layer 131a and the driving gate electrode 125a such that the interval between the driving semiconductor layer 131a and the driving gate electrode 125a is increased. Accordingly, to display the entire grayscale, the driving range of the gate voltage applied to the driving gate electrode 125a is increased.

As a size of the driving transistor and the storage capacitor is increased, image quality is improved. When a driving gate electrode of the driving transistor and the storage capacitor formed with the same layer, the size of the storage capacitor is small when the size of the driving transistor is large, and the size of the driving transistor is small when the size of the storage capacitor is large.

By way of summation and review, embodiments are directed to providing an organic light emitting diode (OLED) display in which the size of a driving transistor and a storage capacitor are both increased and image quality is simultaneously improved. In particular, the driving gate electrode and the storage capacitor may be formed on different layers from each other, e.g., an electrode of the storage capacitor may be an extension of the driving voltage line, thereby increasing the size of the driving transistor and the storage capacitor and simultaneously improving the image quality.

Additionally, by formed the driving semiconductor layer with a non-linear curved shape, a long driving semiconductor layer may be formed in a narrow space such that the driving range of the gate voltage applied to the driving gate electrode may be increased. Therefore, since the driving range of the gate voltage is broad, a grayscale of light emitted from an organic light emitting diode (OLED) can be more finely controlled by changing the magnitude of the gate voltage, and as a result, resolution of the organic light emitting diode display maybe increased and display quality may be improved.

Also, by forming the first gate insulating layer and the second gate insulating layer between the driving gate electrode and the driving semiconductor layer of the driving transistor, an interval between the driving gate electrode and the driving semiconductor layer may be increased such that the driving range of the gate voltage applied to the driving transistor is increased, thereby expressing a sufficient grayscale Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
    a substrate;
    a first semiconductor layer and a second semiconductor layer separated from each other on a same surface of the substrate;

a first insulating layer on the first semiconductor layer and the second semiconductor layer;

a first gate electrode and a second gate electrode respectively overlapping the first semiconductor layer and the second semiconductor layer;

a second insulating layer on the first gate electrode and the second gate electrode;

a first storage electrode overlapping the first gate electrode on the second insulating layer;

a third insulating layer on the first storage electrode;

a second storage electrode overlapping the first storage electrode on the third insulating layer; and a data line and a driving voltage line formed with the same layer as the second storage electrode and respectively transmitting a data signal and a driving voltage.

2. The organic light emitting diode (OLED) display as claimed in claim 1, wherein the first semiconductor layer is a driving semiconductor layer, the second semiconductor layer is a switching semiconductor layer, the first gate electrode is a driving gate electrode, the second gate electrode is a switching gate electrode, the first insulating layer is a gate insulating layer, the second insulating layer is a first interlayer insulating layer, and the third insulating layer is a second interlayer insulating layer.

3. The organic light emitting diode (OLED) display as claimed in claim 2, wherein the driving semiconductor layer has a non-linear shape in plan view.

4. The organic light emitting diode (OLED) display as claimed in claim 3, wherein the non-linear shape is one of curved, a zigzag shape, an elongated "5" shape, a "ㄹ" shape, an "S" shape, an "M" shape, and a "W" shape.

5. The organic light emitting diode (OLED) display as claimed in claim 3, wherein the gate insulating layer includes:

a first gate insulating layer covering the first and second semiconductor layers, and a second gate insulating layer on the first gate insulating layer and covering the switching gate electrode, wherein the driving gate electrode is on the second gate insulating layer.

6. The organic light emitting diode (OLED) display as claimed in claim 3, wherein the driving gate electrode and the switching gate electrode are on a same surface of the first insulating layer.

7. The organic light emitting diode (OLED) display as claimed in claim 1, wherein the second storage electrode is an extension of the driving voltage line.

8. The organic light emitting diode (OLED) display as claimed in claim 7, wherein the first storage electrode is connected to a driving gate electrode through a contact hole in a first interlayer insulating layer.

9. The organic light emitting diode (OLED) display as claimed in claim 8, further comprising:

a protective layer covering a second interlayer insulating layer and the second storage electrode; and an organic light emitting diode (OLED) on the protective layer.

* * * * *